United States Patent [19]

Lindmayer

[11] Patent Number: 5,043,097

[45] Date of Patent: * Aug. 27, 1991

[54] PHOTOLUMINESCENT MATERIAL FOR OUTPUTTING REDDISH-ORANGE LIGHT WITH REDUCED PHOSPHORESCENCE AFTER CHARGING

[75] Inventor: Joseph Lindmayer, Potomac, Md.

[73] Assignee: Quantex Corporation, Rockville, Md.

[ * ] Notice: The portion of the term of this patent subsequent to Jun. 13, 2006 has been disclaimed.

[21] Appl. No.: 362,949

[22] Filed: Jun. 8, 1989

Related U.S. Application Data

[63] Continuation-in-part of Ser. No. 147,215, Jan. 22, 1988, Pat. No. 4,879,186, which is a continuation of Ser. No. 870,809, Jun. 6, 1986, Pat. No. 4,830,875, which is a continuation-in-part of Ser. No. 786,095, Oct. 10, 1985, Pat. No. 4,705,952, which is a continuation-in-part of Ser. No. 313,171, Feb. 21, 1989, Pat. No. 5,012,098.

[51] Int. Cl.$^5$ ............................................. C09K 11/56
[52] U.S. Cl. ....................... 252/301.4 S; 252/301.4 H
[58] Field of Search ................... 252/301.4 S, 301.4 R, 252/301.4 H

[56] References Cited

U.S. PATENT DOCUMENTS 2,521,124  9/1950  Miller ............................ 252/301.4 S
4,747,973  5/1988  Cusano et al. ................ 252/301.4 R
4,839,092  6/1989  Lindmayer .................... 252/301.4 S Primary Examiner—Jack Cooper
Attorney, Agent, or Firm—Ostrolenk, Faber, Gerb & Soffen

[57] ABSTRACT

A photoluminescent material used for detection of infrared light is prepared using a base material, first and second dopants, a carbonate of the base material, and a fusible salt. The base material is an alkaline earth metal sulfide such as calcium sulfide. Calcium carbonate is used to decrease phosphorescence after charging, whereas lithium fluoride is used to allow the material to be fused together. Samarium oxide and europium oxide are used as the first and second dopants for establishing a communication band and an electron trapping level, respectively. The photoluminescent material is made according to a process involving drying the material, heating the material in a graphite crucible to a fusing temperature in a dry inert atmosphere, grinding the material after cooling, and reheating the material to below the fusing temperature, but sufficiently high to repair the crystal surfaces. The material is then placed in a transparent binder and applied to a substrate. Alternatively, thin film techniques may be used to apply the material to a substrate to realize a device with fine optical resolution.

4 Claims, 3 Drawing Sheets

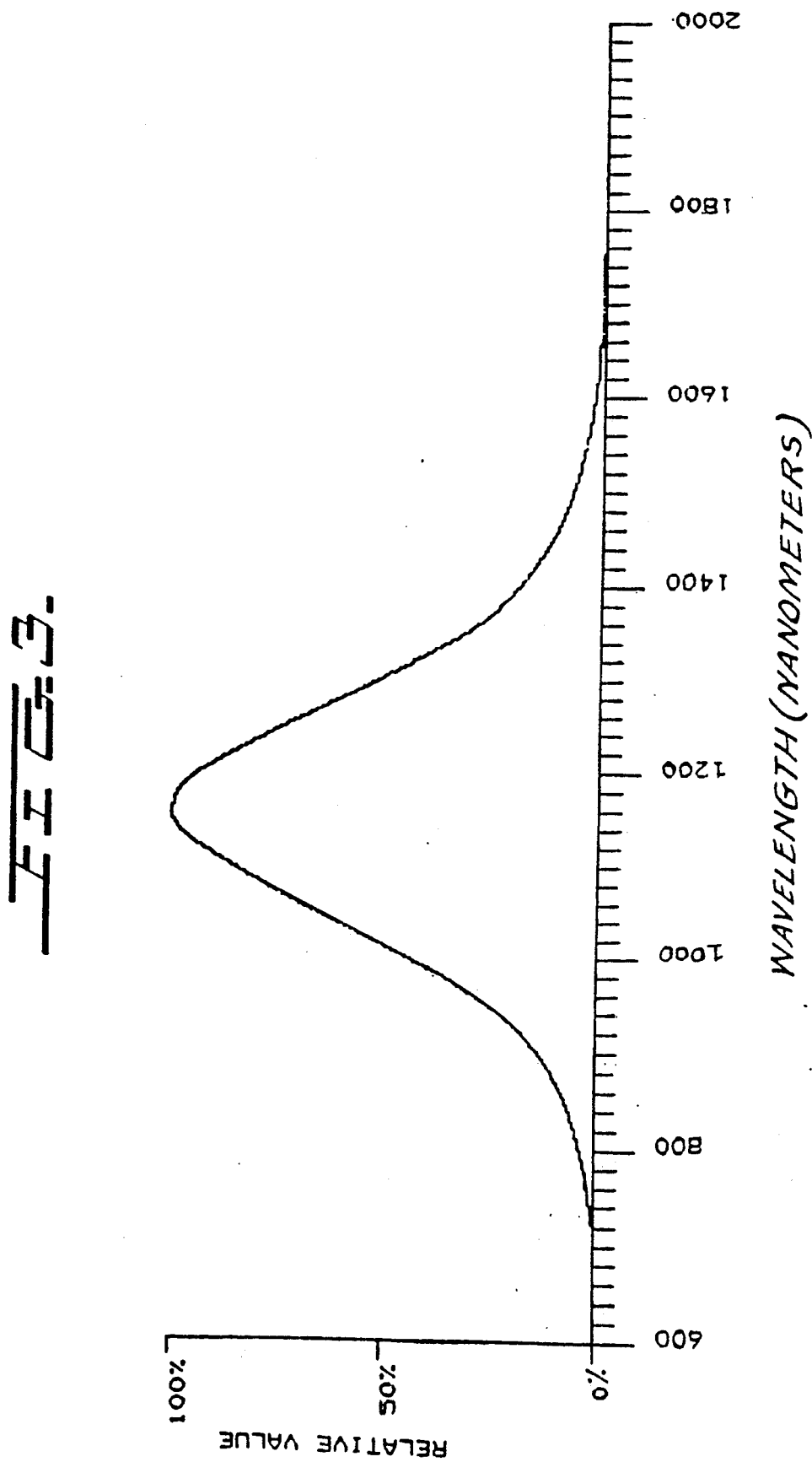

PHOTOLUMINESCENT MATERIAL FOR OUTPUTTING REDDISH-ORANGE LIGHT WITH REDUCED PHOSPHORESCENCE AFTER CHARGING

RELATED APPLICATIONS

This is a continuation-in-part of U.S. application Ser. No. 147,215, filed Jan. 22, 1988, now U.S. Pat. No. 4,879,186, which is a continuation of U.S. Pat. No. 870,809, filed June 6, 1986, now U.S. Pat. No. 4,830,875, which is a continuation-in-part of U.S. application Ser. No. 786,095, filed Oct. 10, 1985, now U.S. Pat. No. 4,705,952.

This is also a continuation-in-part of U.S. application Ser. No. 313,171 filed Feb. 21, 1989, now U.S. Pat. No. 5,012,098 which discloses an infrared sensitive photomultiplier with a faceplate having a layer of upconverting material which is the subject matter of the present application.

The disclosures of all these related applications are herein incorporated by reference.

BACKGROUND OF THE INVENTION

1. Field of the Invention

The present invention relates to an electron trapping material with reduced phosphorescence and a process for making and using such material.

2. Description of the Related Art

In order to define the family of materials involved, it is useful to review the history, particularly since sometimes confusion exists over terminology. It is important to begin with the term luminescence, the ability of certain solids to emit light under different conditions.

Luminescence is a long known phenomenon of nature reaching back very far in history. Recorded observations reach back to the last century. Seeback and Becquerel observed momentary visible afterglow in certain materials. In 1889, Klatt and Lenard also observed some effects with infrared. During this time period, words like "phosphor" and "luminescence" appeared. In 1904, Dahms distinguished between "stimulation" and "quenching"; meaning inducing or stopping afterglow. Much of the later work is associated with Lenard, who received the Nobel Prize in 1905 in physics for cathode ray emission. He studied different phosphors until at least 1918. Later work can be found by Urbach in 1926 through 1934. These early scientists basically observed very small luminescent effects.

In 1941, a program was instituted by the National Defense Research Committee for development of light emitting phosphors. The work started at the University of Rochester, and other laboratories became involved; however, the projects ended with World War II. The following technical papers were published on this work between 1946 and 1989:

B. O'Brien, "Development of Infrared Phosphors", *J. Oct. Soc. of Am.*, vol. 36, July 1946, p. 369;

F. Urbach, et al., "On Infra-Red Sensitive Phosphors", *J. Opt. Soc. of Am.*, vol. 36, July 1946, p. 372;

G. Fonda, "Preparation and Characteristics of Zinc Sulfide Phosphors Sensitive to Infra-Red", *J. Opt. Soc. of Am.*, vol. 36, July 1946, p. 382;

A. L. Smith, "The Preparation of Strontium Selenide and its properties as a Base Material for Phosphors Stimulated by Infra-Red", *Journal of the Am. Chem. Soc.*, vol. 69, 1947, p. 1725; and K. Butler, "Emission spectra of Silicate Phsophors with Manganese Activation", *Journal of the Electrochemical Society*, vol. 93, No. 5, 1948, p. 143.

These papers provide a confusing story on the material studied. As decades went by, the effects were forgotten by most physicists. Only work in the field of cathodoluminescence for screens of cathode ray tubes and fluorescent lamps continued.

Thus, the field of luminescence is broad and refers to the ability of certain solids (and liquids) to emit light when driven by an external energy source. When the driving energy source is light, the proper term is photoluminescence.

There is yet another interesting class of materials which upon excitation by illumination can store electrons in "traps" for varying lengths of time is discussed by J. L. Summerdijk and A. Bril, in "Visible Luminescence . . . Under IR Excitation", International Conference on Luminescence, Leningrad, August 1972, p. 86. In the case of deep traps, trapped electrons can be released at a later time by photons having an energy similar to the depth of the trap. Thermal discharging is negligible in the case of deep traps. Under these circumstances, it appears that light has been "stored" for later use and emission of visible light can be activated by infrared. In the case of shallow traps, spontaneous emission will occur at room temperature because the thermal agitation is sufficient to excite electrons out of the traps. These materials are now called electron trapping optical materials.

The fundamentals of electron trapping material are the following: A host crystal is a wide bandgap semiconductor (II-VI compound), normally without any special value. These crystals, however, can be doped heavily with impurities to produce new energy levels and bands. Impurities from the lanthanide (rare earth) series are readily accommodated in the lattice and form a "communication" band and a trapping level. The communication band replaced the original conduction band and provides an energy level at which the electrons may interact. At lower energies the trapping level represents non-communicating sites.

Materials that contain sites where luminescent activity occurs often include one or more types of these sites where electrons may be trapped in an energized state. Upon application of suitable wavelengths of energizing radiation such as visible light or x-rays, such sites produce free energized electrons. The free electrons are raised to an energized state within a communication band where transitions such as absorption and recombination may take place. Upon removal of the energizing radiation, the free electrons may be trapped at an energy level higher than their original ground state or may drop back to their original ground state. The number of electrons that become trapped is very much dependent upon the compositions of the photoluminescent material and the dopants used therein.

If the trapping material is sufficiently below the level of the communication band, the electron will be isolated from other electrons and will remain trapped for a long period of time, and will be unaffected by normal ambient temperature. Indeed, if the depth of the trap is sufficient, the electron will remain trapped almost indefinitely unless the electron is energized by energy from light, other electromagnetic energy, or thermal energy much higher than room temperature.

The electron will remain trapped until light or other radiation is applied to provide sufficient energy to the electron to again raise its energized state to the communication band where a transition may take place in the form of recombination allowing the electron to escape from the trap and release a photon of visible light. The material must be such that room temperature thermal energy is insufficient to allow any significant portion of trapped electrons to escape from their traps. As used herein, "optical energy" shall include visible light, infrared light, and ultraviolet light unless otherwise noted, "photoluminescent material" is a material that exhibits the above characteristics.

Although various photoluminescent material have hereto been known, the properties of such materials have often been less than desirable. For example, photoluminescent materials have been used for locating infrared beams by outputting visible light upon placement of the material within an infrared beam, but such previous photoluminescent material are not sensitive enough to detect relatively low levels of infrared radiation. The visible light output by such materials is often at a very low level such that detection of the visible light is difficult. Further, such materials commonly have electron traps with insufficient depth and/or a relatively low density of electron traps such that it is difficult to maintain the electrons trapped for extended periods of time. The ratio of the energy of light input to energy of light output in such material is often quite high. That is, a relatively large amount of energy must be put into the material to provide a given output optical energy.

The development of photoluminescent materials that avoid or minimize the disadvantages discussed above would open up numerous other applications for such materials. Such a photoluminescent material for outputting reddish-orange light is disclosed and claimed in U.S. application Ser. No. 147,215, filed Jan. 22, 1988, now U.S. Pat. No. 4,879,186. However, the material described in that patent has an associated phosphorescence after charging, which is undesirable in certain applications. For example, when the material is to be used as an upconverter for an infrared sensitive photomultiplier, as described in Ser. No. 313,171 filed Feb. 21, 1989, now allowed any significant phosphorescence after charging would be detected by the photomultiplier and converted into an electrical signal erroneously indicative of incident infrared radiation.

SUMMARY OF THE INVENTION

Accordingly, the primary subject of the present invention is to provide a new photoluminescent material for outputting reddish-orange light with reduced phosphorescence.

Another object of the present invention is to provide a new and improved process for making a photoluminescent material for outputting reddish-orange light with reduced phosphorescence.

The above and other objects of the present invention, which will become more apparent as the description proceeds, are realized by an electron trapping photoluminescent material consisting essentially of a base material, a first dopant, a second dopant, a carbonate of the base material, and a fusible salt. More specifically, the photoluminescent material comprises: a base material selected from a group of alkaline earth metal sulfides (preferably calcium sulfide); a first dopant of samarium or a samarium compound (preferably samarium oxide); a second dopant selected from the group of europium oxide, europium fluoride, europium chloride, and europium sulfide; up to 10 parts of calcium carbonate for every 100 parts of calcium sulfide; and up to 10 parts fusible salt for every 100 parts of base material.

The invention further comprises the photoluminescent material described above disposed upon a substrate. If desired, the photoluminescent material may be applied upon the substrate by use of a transparent binder. Mixing the transparent binder into the photoluminescent material will not significantly affect the optical properties of the photoluminescent material. Reference in this application to "consists essentially of the base material, first dopant, second dopant, calcium carbonate, and fusible salt" shall be interpreted as including those materials alone or in combination with a transparent binder.

The process of the present invention comprises the steps of mixing a base material, a first dopant of samarium, or a samarium compound, a second dopant of a europium compound, a carbonate of the base material, and a fusible salt; after mixing, drying the mixture in an inert atmosphere, and then heating the resultant mixture in the inert atmosphere to a first temperature sufficient to fuse the mixture into crystalline form. The drying step is accomplished by placing the mixture in a dry inert atmosphere for approximately one hour at 150° C. The first heating step takes place with the mixture in a graphite crucible in a furnace with an inert atmosphere and a temperature of about 1300° C.

A further processing direction comprises the steps of grinding the resultant crystalline form into a powder; and after grinding, reheating the resultant powder to a second temperature below the first temperature, but sufficiently high to repair crystal edges of the powder, thereby yielding an electron trapping optical material without fusing the powder into a mass. The grinding step yields a powder having particle sizes of 100 microns or less. The process may further include a step of mixing the optical material with a transparent binder and applying it to a substrate.

Another processing direction comprises the steps of creating chunks of the original fused material and depositing it on a smooth foreign substrate in the form of thin film, such as by evaporation or sputtering, reheating the resultant film to a second temperature below the first temperature, but sufficiently high to form a surface crystallized film, thereby yielding an electron trapping optical material with high optical resolution.

BRIEF DESCRIPTION OF THE DRAWINGS

The above and other features of the present invention will be more readily understood when the following detailed description is considered in conjunction with the accompanying drawings, wherein like characters represent like parts throughout the several views and in which:

FIG. 3 shows the infrared interrogation response of the photoluminescent material of the present invention.

FIG. 4 shows a cross-section of photoluminescent material disposed on a substrate.

DETAILED DESCRIPTION OF THE PREFERRED EMBODIMENT

Figure 1:
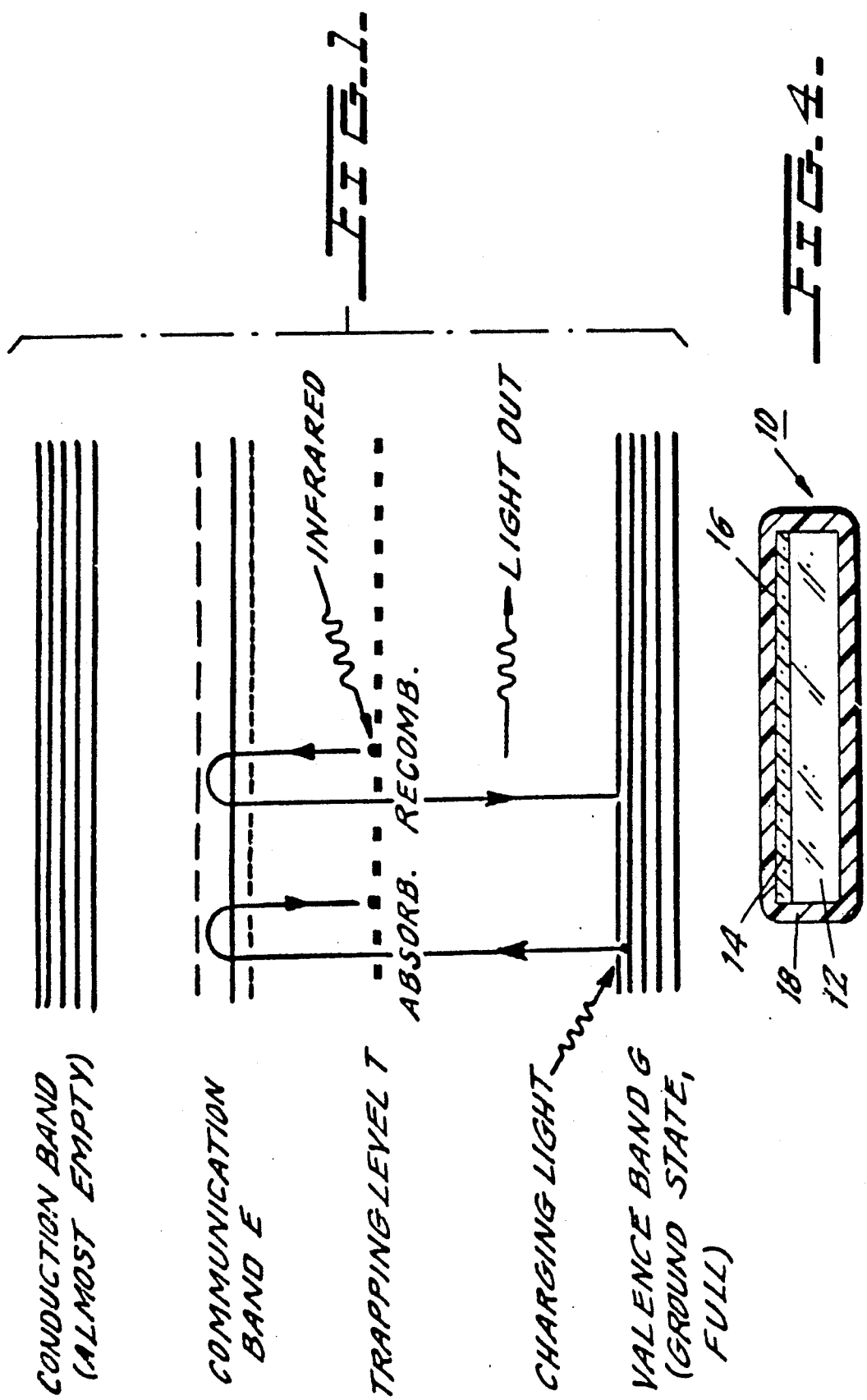
FIG. 1 is a schematic illustrating the principle of operation of the present invention.

FIG. 1 shows the principles of operation of the present invention. The basic crystalline photoluminescent material used has a valence band G full of electrons at a ground state. The material is subjected to visible light, which functions to energize certain electrons in the valence band G. An electron shown on the left is originally in a valence band G and is subjected to visible charging light. The electron absorbs a photon raising its energy level to a communication band E where communication takes place with other energized electrons resulting in transitions. Upon removal of the energizing light, the electron may drop back to a trapping level T or back to the valence band G depending upon the composition of the material and available trapping sites. The electron, if in the trapping level T, will remain isolated from other electrons and trapped until sufficient additional energy is provided to the electron to raise its energy back up to the communication band E.

As shown on the right side of FIG. 1, an electron may be stimulated by infrared electromagnetic energy to move it back to the communication band E, where it may interact with other electrons and undergo recombination causing it to move back to the valence band G and output a photon of visible light in the process. The materials of the present invention work upon the principle illustrated by FIG. 1 whereby light may be "stored" by the phenomenon of electron trapping and the light may be freed by application of infrared radiation to push the electron up above the trap and allow it to return to the valence band. The number of trapping sites, the depth of the traps and the probability of transitions occurring in the communication band are all dependent upon the composition of the photoluminescent material used.

As previously mentioned, the photoluminescent material of the present invention comprises a base material, a first dopant, and a second dopant. A carbonate of the base material is added to reduce phosphoresence, and a fusible salt such as lithium fluoride is useful in certain embodiments.

The base material may be selected from the group of alkaline earth metal sulfides such as calcium sulfide. The first dopant is samarium or a samarium compound such as samarium oxide, and the second dopant is selected from the group of europium oxide, europium fluoride, europium chloride, and europium sulfide.

The photoluminescent material for outputting reddish-orange light with reduced phosphorescence after charging is preferably made from a mixture having the following composition:

| Calcium sulfide | 87.20 parts |
| Calcium carbonate | 5.13 parts |
| Lithium fluoride | 7.62 parts |
| Samarium oxide | 170 parts per million |
| Europium oxide | 340 parts per million |

As used above and throughout this application, "parts" and "parts per million" shall refer to parts by weight unless otherwise noted.

The mixture is placed into a dry graphite crucible and dried within a furnace flushed with a dry nitrogen atmosphere (derived from a liquid source) or other dry inert atmosphere such as argon at 150° C. for about one hour. The dried mixture is then heated in the crucible in the dry atmosphere of a temperature of about 1300° C. for 30 minutes to one hour such that a fused mass is formed. This fusing temperature is about 100°–200° C. higher than that disclosed in U.S. application Ser. No. 147,215, filed Jan. 22, 1988, now U.S. Pat. No. 4,879,186.

After cooling, the fused mass is ground using standard techniques into a powder having a particle size on the order of 100 microns or less.

After grinding, the powdered material is heated to about 300° C. to 700° C. (preferably 600° C.) in the graphite crucible within the nitrogen or other inert atmosphere furnace. This second heating is below the fusing temperature of the material (about 700° C.) and is maintained for 10 to 60 minutes (preferably 30 minutes). This second heating step removes internal stresses and repairs damage done to the crystalline surfaces during the grinding step.

After the second heating, the material is cooled and the powdered material is then mixed with a suitable binder or vehicle such acrylic, polyethylene, or other organic polymer.

After the material has been mixed with a transparent binder, it is applied as a thin coating to a substrate. The coating of the photoluminescent material upon the substrate will preferably be within 1 micron and 500 microns in thickness. Depending upon the use to be made of the material, the substrate may be clear plastic, aluminum oxide, glass, paper, or most any other solid substance.

In the above mixture, the calcium sulfide serves as a base material whereas the lithium fluoride operates to provide the fusibility characteristics useful for the specific embodiment. Alternatively, other alkaline earth metal sulfides might be used as a base material. Similarly, a cerium compound dopant can be used in lieu of the europium compound dopant to yield a blue-green output rather than an reddish-orange output. However, the above reddish-orange emitting material is preferred because it has a brighter output.

The calcium carbonate in the above mixture is used in place of the barium sulfate disclosed in U.S. Pat. No. 4,879,186 to decrease phosphorescence. Preferably 5.13 parts are used as noted above, but between 1 and 10 parts may be used of the calcium carbonate as well as up to 10 parts of lithium fluoride relative to the 87.20 parts of calcium sulfide.

The samarium oxide and europium oxide in the above mixture are used for establishing the communication band and the electron trapping level. Preferably 170 parts per million of samarium oxide are used, but the samarium oxide could alternatively be between 20 parts per million and 300 parts per million. The europium oxide may be between 100 and 800 parts per million, with 340 parts per million being preferred.

Figure 2:
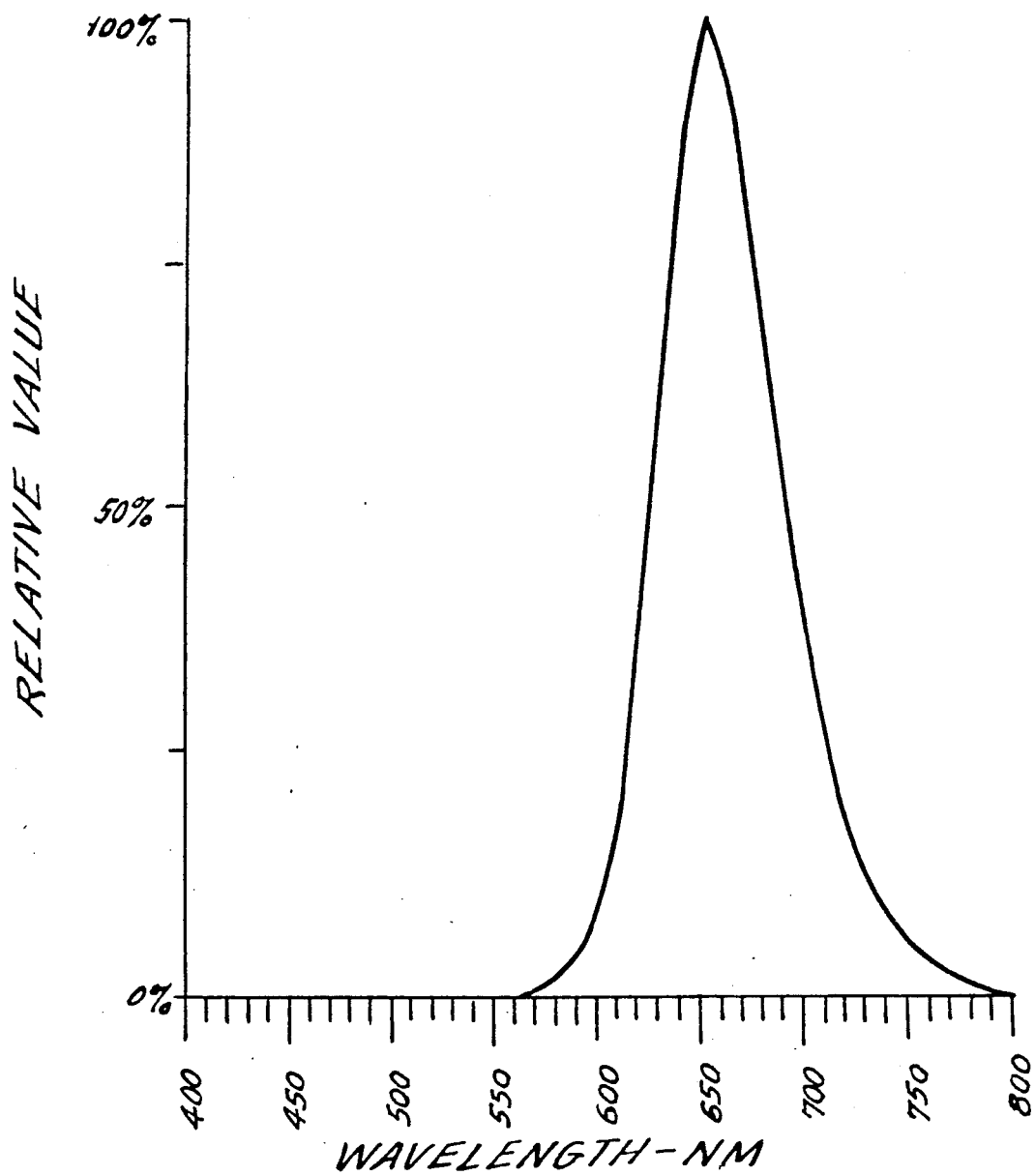
FIG. 2 shows the spectrum of light output by photoluminescent material of the present invention.

The mixture resulting from the above process provides a depth for electron traps of about 1.1 electron volts below the communication band and has an output spectrum as shown in FIG. 2 which illustrates that the center frequency of the output has a wave-length of approximately 650 nanometers, corresponding to a reddish-orange light. The IR sensitivity, shown in FIG. 3, ranges from about 0.8 micron to 1.7 microns and peaks at about 1.2 microns, thus providing an expanded range over a similar photoluminescent material with a strontium sulfide base disclosed in U.S. application Ser. No. 363,060, filed on even date herewith.

Thin film techniques, such as described in U.S. application Ser. No. 184,263 filed Apr. 21, 1988, now U.S. Pat. No. 4,915,982 (herein incorporated by reference), may also be used to apply the material to a substrate. In this case, the listed materials (within ranges specified above) are deposited upon a substrate of aluminum oxide by any known thin-film technique including physical vapor deposition (evaporation, sputtering, etc.), chemical vapor deposition, gaseous diffusion, ion beam deposition, molecular beam deposition, and electron beam deposition.

The listed materials can be mixed and then physically deposited on the substrate or the materials can be individually deposited. However, this is much more difficult and provides no additional benefits. A particularly successful method has been to mix the materials, hot press them into a solid and then evaporate or sputter them onto the substrate. The materials and substrate are placed into a furnace and fused under the conditions specified above. The material fuses without the use of lithium fluoride. Because the photoluminescent material bonds so well to the aluminum oxide substrate, the use of separate binders or vehicles is not necessary. If the substrate is aluminum oxide in the form of sapphire or ceramic, the layer of photoluminescent material can be as thin as 0.5 microns, resulting in a micro-crystalline form of optical material.

The structure resulting from the fusing step may optionally be encapsulated in clear plastic to realize the device 10 of FIG. 4. No grinding or reheating is necessary. The thin film process may be used to apply the photoluminescent material to an aluminum oxide disc to provide an optical memory that could likewise be coated by clear plastic.

Obviously, the particular type of material employed in the present invention depends upon the sensitivity desired. The material described herein is considered optimum for most applications because it causes the greatest shift in response; i.e., it is sensitive to light of relatively long wavelengths. However, if sensitivity to shorter infrared wavelengths is more important, e.g. detection of the output of a Nd:YAG laser, the optimum material would be that described in U.S. application Ser. No. 363,060, filed in even date herewith.

The optical materials of the present invention may be used for IR sensing, photography, and/or as a memory by using their electron trapping characteristics. The materials may be used in powder form (i.e., the form after grinding), and microcrystalline form.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electron trapping photoluminescent material formed by a process comprising the steps of:
    forming a mixture consisting essentially of:
        a base material of substantially calcium sulfide;
        a fusible salt consisting of lithium fluoride provided in a quantity of up to 10 parts per 100 parts of base material by weight;
        a first dopant of samarium oxide provided in a quantity of between 20 and 300 parts per million by weight;
        a second dopant of europium oxide provided in a quantity of between 100 and 800 parts per million by weight; and
        calcium carbonate provided in quantity of from 1 to 10 parts per 100 parts of base material by weight;
    thoroughly drying the mixture by placing it in a graphite crucible within a furnace flushed with a dry inert atmosphere;
    heating the resultant mixture in the graphite crucible within the furnace flushed with a dry inert atmosphere at a temperature of about 1300° C. to effect a crystalline form;
    grinding the resultant crystalline form into a powder having particle sizes of 100 microns or less; and
    reheating the resultant powder in an inert atmosphere at a temperature of about 300° and 700° to repair crystal edges of the powder to yield an electron trapping photoluminescent material without fusing the powder into a mass;
    wherein said electron trapping photoluminescent material exhibits a lower phosphorescence than the same material prepared as above absent calcium carbonate.

2. The photoluminescent material of claim 1, wherein the samarium oxide is provided in a quantity of about 170 parts per million by weight.

3. The photoluminescent material of claim 1, wherein the europium oxide is provided in a quantity of about 340 parts per million by weight.

4. The photoluminescent material of claim 1, wherein the material outputs a reddish-orange light when subjected to infrared radiation.

* * * * *